United States Patent
Krassnitzer et al.

(10) Patent No.: US 9,267,200 B2
(45) Date of Patent: Feb. 23, 2016

(54) METHOD FOR SUPPLYING SEQUENTIAL POWER IMPULSES

(75) Inventors: Siegfried Krassnitzer, Feldkirch (AT); Daniel Lendi, Grabs (CH); Markus Lechthaler, Feldkirch (AT); Kurt Ruhm, Schaanwald (LI)

(73) Assignee: OERLIKON SURFACE SOLUTIONS AG, TRUBBACH, Trubbach (CH)

( * ) Notice: Subject to any disclaimer, the term of this patent is extended or adjusted under 35 U.S.C. 154(b) by 0 days.

(21) Appl. No.: 14/112,757

(22) PCT Filed: Apr. 4, 2012

(86) PCT No.: PCT/EP2012/001484
§ 371 (c)(1),
(2), (4) Date: Feb. 27, 2014

(87) PCT Pub. No.: WO2012/143091
PCT Pub. Date: Oct. 26, 2012

(65) Prior Publication Data
US 2014/0190819 A1    Jul. 10, 2014

(30) Foreign Application Priority Data

Apr. 20, 2011 (DE) .................. 10 2011 018 363
Oct. 28, 2011 (DE) .................. 10 2011 117 177

(51) Int. Cl.
C23C 14/34 (2006.01)
H01J 37/34 (2006.01)
C23C 14/35 (2006.01)

(52) U.S. Cl.
CPC ......... *C23C 14/3485* (2013.01); *C23C 14/3407* (2013.01); *C23C 14/3492* (2013.01); *C23C 14/352* (2013.01); *H01J 37/3467* (2013.01)

(58) Field of Classification Search
CPC ............ C23C 14/3485; C23C 14/3407; C23C 14/3492; C23C 14/352; H01J 37/3467
USPC ........................................ 204/298.08, 192.12
See application file for complete search history.

(56) References Cited

U.S. PATENT DOCUMENTS

| | | | | |
|---|---|---|---|---|
| 6,063,245 | A * | 5/2000 | Frach et al. | 204/192.15 |
| 7,927,466 | B2 * | 4/2011 | Ganciu-Petcu et al. | 204/192.12 |
| 2005/0103620 | A1 * | 5/2005 | Chistyakov | 204/192.12 |
| 2006/0260938 | A1 * | 11/2006 | Petrach | 204/298.16 |
| 2008/0202924 | A1 * | 8/2008 | Bluck et al. | 204/298.08 |

FOREIGN PATENT DOCUMENTS

| | | |
|---|---|---|
| DE | 10 2006 017 382 A1 | 5/2007 |
| DE | 20 2010 001 497 U1 | 4/2010 |
| DE | 10 2011 018 363 A1 | 10/2012 |
| WO | 2007/054048 A1 | 5/2007 |
| WO | 2009/132822 A2 | 11/2009 |
| WO | 2012/089286 A1 | 7/2012 |

OTHER PUBLICATIONS

International Search Report for PCT/EP2012/001484 dated Oct. 5, 2012.

* cited by examiner

*Primary Examiner* — John Brayton
(74) *Attorney, Agent, or Firm* — Pearne & Gordon LLP

(57) ABSTRACT

The invention relates to a method for supplying power impulses for PVD sputtering cathodes subdivided into partial cathodes. In said method, the power impulse intervals acting on the partial cathodes are selected in such a way as to overlap, thereby dispensing with the need to interrupt the drawing of power supplied by the generator.

14 Claims, 1 Drawing Sheet

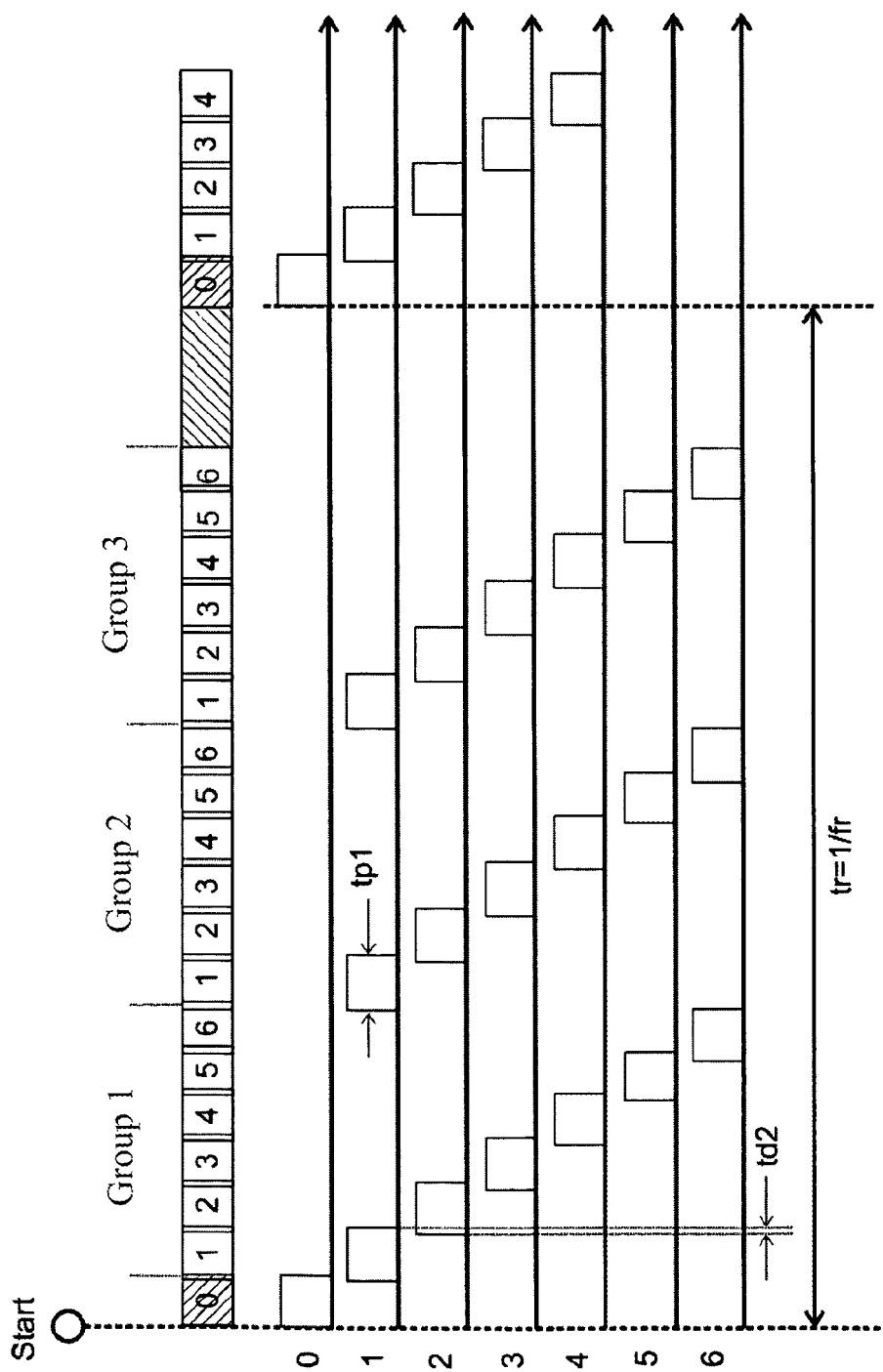

METHOD FOR SUPPLYING SEQUENTIAL POWER IMPULSES

The present invention relates to a method for generating power impulses.

Such power impulses are required for example in the context of HIPIMS technology. HIPIMS stands for High Power Impulse Magnetron Sputtering. This is a vacuum coating process with which material is sputtered from a cathode by means of very high discharge currents, which guarantees that the sputtered material is positively ionized to a high degree. If simultaneously a negative voltage is applied to the substrate to be coated, this has the consequence that the positive ions generated by the sputtering are accelerated in the direction of the substrate and thus result in the formation of a dense layer. In this connection, outputs of e.g. 40 kW and more are used. However, it is only possible to sputter material from the cathode in the frame of a short power impulse, since said cathode during a longer power exposure can suffer damage from overheating. It is thus necessary to limit the time during which it is possible to sputter from a cathode at high power, which results in a maximum allowable impulse duration.

One approach for achieving this consists in dividing the whole cathode into partial cathodes and to apply the power sequentially in succession to the partial cathodes. What this concept means is that several cathodes insulated from one another (here called partial cathodes) are provided in the coating facility so that a high discharge current can be achieved in a locally limited manner. One possible embodiment of this approach is described in German patent application DE102011018363.

During one power impulse that acts on a partial cathode, sputtering with a high discharge current density occurs from this cathode. Simultaneously, the other partial cathode or cathodes can cool down before a power impulse acts on them again.

However, the inventors have observed that the impulse duration itself has a strong influence on the layer properties of the layer produced by means of magnetron sputtering. Generators are thus required that are capable of supplying both very short as well as relatively long lasting high power impulses.

Generators usually supply a constant voltage at constant current. In German, they are called "Leistungsversorgung", which translated in English means power supply.

The situation becomes challenging when, as described above, it becomes necessary to generate short power impulses at high power. When switching on the power supply that is supposed to deliver an output of e.g. 40 kW, a timespan on the order of approx. 700 µs will elapse until complete power delivery when using the commercially available voltage sources. If, as in the present case, power impulses are required with a shorter impulse duration, the time available has already elapsed before full power is developed. Accordingly, the output profile of such impulses is dynamically uncontrolled and the sputtering process based thereupon results in layers that are difficult to reproduce and suboptimal in terms of their properties.

The present inventive method should therefore provide a possibility to achieve, in an easy manner, power impulses with a defined profile, wherein the duration of the power impulses can be scaled over broad intervals in an easy manner.

According to the invention, the aim is achieved in that the power impulse intervals assigned to a first partial cathode slightly overlap in time with the power impulse intervals assigned to a second partial cathode in such a manner that when the power is redirected from the first partial cathode to the second partial cathode, the generator supplying the power does not need to be switched off but rather the power is drawn from the generator without interruptions and it is thus not necessary for it to develop again its full power. During the overlap time of the two power impulse intervals, the plasma burns only on the first partial cathode since the respective impedance is considerably lower relative to the impedance of the not yet ignited second partial cathode. It is only when at the end of the first power impulse interval the first partial cathode is separated from the generator that the plasma ignites on the second partial cathode, yet so quickly that it results in an essentially continuous power draw from the generator. If a third partial cathode is present, it must be ensured that the power impulse interval assigned to the third partial cathode slightly overlaps with the power impulse interval assigned to the second partial cathode so that again when redirecting the power from the second partial cathode onto the third partial cathode no interruption of the power draw occurs. Generally speaking, the power impulse interval assigned to the nth partial cathode slightly overlaps with the power impulse interval assigned to the (n−1)th partial cathode, whereby when the power is redirected from the (n−1)th partial cathode onto the nth partial cathode, an interruption of the power drawn from the generator is avoided. It is only when the power has been redirected onto the last partial cathode and the power impulse assigned to this last partial cathode has been delivered, i.e. when a power impulse cycle—hereinafter also called group—has been completed that the power draw from the generator is interrupted. The subsequent power break is used for cooling the partial cathodes before the first partial cathode is again fed at the appropriate interval with the power impulse assigned to it.

Such an approach will however result in at least the power impulse delivered to the first partial cathode being in the time window during which the generator develops its power and the corresponding power impulse accordingly has an undesirable profile. Thus, according to a preferred embodiment of the present invention, prior to feeding the first partial cathode with power, for at least approximately the power development interval a so-called dummy cathode is fed with power. It is then ensured that the power impulse interval assigned to the first partial cathode slightly overlaps with the power development interval, whereby when redirecting from the dummy cathode onto the first partial cathode an interruption of the power drawn from the generator is avoided and in the course of the first power impulse interval essentially full power is already available. The above-mentioned dummy cathode can for example be executed with an electric circuit with ohmic resistance where the corresponding voltage falls and the power is thus converted into heat.

As previously mentioned, the power development interval can by all means be on the order of 700 µs. The power delivered during this interval by the generator to the dummy cathode is not used for the coating process, i.e. it is lost and constitutes a loss. This is unproblematic if the power impulse cycle, i.e. the group interval, is large compared with the power development interval and the power loss constitutes merely a small percentage. This is however problematic if the power impulse intervals become so small that the power development interval by comparison with the group interval becomes quite relevant. In such a case, the result is a significant and thus inacceptable power loss.

This can be avoided with a further preferred embodiment of the present invention, as the inventors have realized that especially for short power impulse intervals, it is not at all necessary to cool the partial cathodes. In this case, the first power impulse cycle is followed by a second power impulse cycle. In doing so, it must be ensured that the first power impulse interval of the second power impulse cycle (i.e. of the second group) slightly overlaps with the last power impulse interval of the first power impulse cycle of the first group, so that redirecting the power from the last partial cathode onto the first partial cathode is possible without interruption of the power drawn from the generator. This allows a power development interval for the second group and the power loss involved in drawing the power onto the dummy cathode to be avoided. It is possible in an appropriate manner to string together as many groups until an interruption has to or should effectively take place due to the heat generation occurring at the partial cathodes. In such a sequence of groups, it is only once at the beginning of the sequence that it will be necessary to direct the power during the power development interval onto the dummy cathode.

The invention will now be explained in detail and on the basis of diagrams by way of example on the basis of sputter technology.

The following abbreviations will be used for the examples hereinafter:

Pavg average sputter power
Pmax maximal sputter power (pulse power)
tpn pulse length
tdn pulse lag
N number of groups (N=0 . . . 500)
n channel number (=number of partial cathodes, n=0 . . . 8, n=0 corresponds to the dummy cathode)
fr repetition frequency
tr duration of repetition=1/fr In order to prevent a cathode from overheating, it is assumed that within a power sequence over the entire time during which power is applied onto a partial cathode must be less than 100 ms:

$$(tpn-tdn)*N < 100 \text{ ms} = T\text{max}$$

EXAMPLE 1

In the frame of the first example, the dummy cathode is fed with power for 0.5 ms, i.e. the loss interval tp0 is 0.5 ms and thus surely includes the power development interval of approx. 0.25 ms. In addition to the dummy cathode, 6 partial cathodes are used. The power impulse intervals during which, in one group, power is applied to a partial cathode are set at tp1-6=0.2 ms and the overlap of the power impulse intervals is set at td1-6=0.02 ms. Overall, 10 power impulse cycles are run, i.e. 10 groups together with the loss interval form one sequence. The total sequence interval thus has a duration of 10*6*(0.2 ms–0.02 ms)+0.5 ms=10.8 ms+0.5 ms=11.3 ms.

Hence, a loss interval of 0.5 ms stands against a power delivery time of 10.8 ms used for the coating purpose. As compared to the power loss on the dummy cathode, more than 20 times as much power is thus used for coating purposes.

If during the power impulse interval there are 40 kW on a partial cathode and if an average sputtering power of 5 kW is specified for each partial cathode, the overall sequence interval should be repeated with a frequency of 69.4 Hz, as the following is true:

$$(tpn-tdn)*N*P\text{max}*fr = 0.18 \text{ ms}*10*40 \text{ kW}*69.4 \text{ Hz} = 5 \text{ kW}.$$

This is in contrast to an average power loss on the dummy cathode of maximum 0.5 ms*40 kW*69.4 Hz=1.39 kW. A repetition frequency of 69.4 Hz corresponds to a repetition lasting 14.4 ms. For a total sequence interval lasting 11.3 ms, this means that between the sequences a pause of 3.1 ms should be incorporated.

EXAMPLE 2

In the frame of the second example, the power impulse interval is reduced to 0.07 ms and the number of groups is increased to 100. The other parameters remain the same. The overall sequence interval thus lasts 100*6*(0.07 ms–0.02 ms)+0.5 ms=30 ms+0.5 ms=30.5 ms.

A loss interval of 0.5 ms is thus in contrast with a time of 30 ms for power delivery used for the coating purposes. As compared with the power loss on the dummy cathode, more than 60 times as much power is thus used for coating purposes.

If during the power impulse interval there are 40 kW on a partial cathode and if an average sputtering power of 5 kW is specified for each partial cathode, the overall sequence interval should be repeated with a frequency of 25 Hz, as the following is true:

$$(tpn-tdn)*N*P\text{max}*fr = 0.05 \text{ ms}*100*40 \text{ kW}*25 \text{ Hz} = 5 \text{ kW}.$$

This is in contrast to an average power loss on the dummy cathode of maximum 0.5 ms*40 kW*25 Hz=0.5 kW. The repetition frequency of 25 Hz corresponds to the repetition lasting 40 ms. For a total sequence interval lasting 30.5 ms, this means that between two sequences a pause of 9.5 ms should be incorporated.

EXAMPLE 3

In the frame of the third example, the power impulse interval is reduced to 0.05 ms and the number of groups is increased to 1000. The other parameters remain the same. The overall sequence interval thus lasts 1000*6*(0.05 ms–0.02 ms)+0.5 ms=180 ms+0.5 ms=180.5 ms.

A loss interval of 0.5 ms is thus in contrast with a time of 180 ms for power delivery used for the coating purposes. As compared with the power loss on the dummy cathode, more than 380 times as much power is thus used for coating purposes.

If during the power impulse interval there are 60 kW on a partial cathode and if an average sputtering power of 5 kW is specified for each partial cathode, the overall sequence interval should be repeated with a frequency of 2.7 Hz, as the following is true:

$$(tpn-tdn)*N*P\text{max}*fr = 0.03 \text{ ms}*1000*60 \text{ kW}*2.7 \text{ Hz} = 4.86 \text{ kW},$$

This is in contrast to an average power loss on the dummy cathode of maximum 0.5 ms*60 kW*2.7 Hz=81 W. The repetition frequency of 2.7 Hz corresponds to the repetition lasting 380 ms. For a total sequence interval lasting 180.5 ms, this means that between two sequences a pause of 179.5 ms should be incorporated.

EXAMPLE 4

In the frame of the fourth example, the power impulse interval of 0.05 ms and the number of groups of 1000 are maintained, as well as the other parameters. The overall sequence interval thus lasts 1000*8*(0.05 ms–0.02 ms)+0.5 ms=180 ms+0.5 ms=180.5 ms.

A loss interval of 0.5 ms is thus in contrast with a time of 180 ms for power delivery used for the coating purposes. As compared with the power loss on the dummy cathode, more than 360 times as much power is thus used for coating purposes.

If during the power impulse interval there are no longer 60 kW on a partial cathode as in example 3 but only 33 kW, and if an average sputtering power of 5 kW is specified for each partial cathode, the overall sequence interval should be repeated with a frequency of 5.05 Hz, as the following is true:

$$(tpn-tdn)*N*P\max*fr=0.03 \text{ ms}*1000*33 \text{ kW}*5.05 \text{ Hz}=5 \text{ kW}.$$

This is in contrast to an average power loss on the dummy cathode of maximum 0.5 ms*33 kW*5.05 Hz=83 W. The repetition frequency of 5.05 Hz corresponds to the repetition lasting 198 ms. For a total sequence interval lasting 180.5 ms, this means that between the sequences a pause of only 17.5 ms should be incorporated between two sequences.

As the examples outlined above show, the inventive method enables a simple scalability of the impulse duration, impulse height, impulse repetition frequency as well as the exact definition of the impulse profile with a nearly dwindlingly low power loss. All these variables, which can be summarized under the keyword of scalable impulse characteristic, in sputtering and in particular in the frame of HIPIMS technology have a direct influence on the properties of the layers being generated. Although the description represents the supplying of power impulses in the frame of sputter technology, it is advantageously applicable everywhere where comparatively high power needs to be applied in the frame of impulses on a load.

FIG. 1 shows the situation corresponding to the examples, both as uniform sequence as well as split up in the loss interval (0) and the power impulse interval on the partial cathodes (1-6). The horizontal axis represents the time axis and the vertical axis corresponds to the output delivered by the generator, wherein in the areas of the overlaps (e.g. td1), the power needs to be divided between two loads, which is not shown in the FIGURE. However, only 3 groups are shown in the FIGURE.

What is claimed is:

1. Method for supplying power impulses with a scalable power impulse interval for operating a PVD sputtering cathode, with the PVD sputtering cathode comprising a first partial cathode and a second partial cathode, wherein for the partial cathodes a maximum average power feed is prescribed and the duration of the power impulse intervals is prescribed, and the method comprising the following steps:
    a) providing a generator with a predefined power output of at least 20 kW that is constant at least after switching on and after expiration of a power development interval,
    b) switching on the generator,
    c) connecting the first partial cathode to the generator so that the first partial cathode is fed with power from the generator,
    d) separating the generator from the first partial cathode after expiration of a predefined first power impulse interval corresponding to the first partial cathode,
    e) connecting the second partial cathode to the generator so that the second partial cathode is fed with power from the generator,
    f) separating the generator from the second partial cathode after expiration of a predefined second power impulse interval corresponding to the second partial cathode,
    wherein the first power impulse interval starts time-wise before the second power impulse interval and the first power impulse interval ends time-wise before an end of the second power impulse interval,
    wherein the steps d) and e) are executed in such a manner that the first power impulse interval and the second power impulse interval overlap in time and all power impulse intervals form together a first group, so that the power output from the generator remains sustained without interruption from the beginning of the first power impulse interval until the end of the second power impulse interval and a second power development interval does not occur,
    wherein during the overlap in time of the first power impulse interval and the second power impulse interval, a plasma burns only on the first partial cathode and, at the end of the first power impulse interval when the first partial cathode is separated from the generator, the plasma ignites on the second partial cathode such that the power impulse draw from the generator is uninterrupted.

2. Method according to claim 1, wherein when the first power impulse interval and the second power impulse interval have different durations, the overlap in time between the first power impulse interval and the second power impulse interval is no larger than x % of the power impulse interval that has a shorter duration, wherein x is smaller than or equal to 20.

3. Method according to claim 1, wherein the PVD sputtering cathode comprises a further partial cathode, wherein the further partial cathode is connected according to steps e) and f) to the generator and is separated from it, wherein the power impulse interval assigned to the further partial cathode that is next in the sequence overlaps in time with the power impulse interval corresponding to the partial cathode that was immediately before it in the sequence, and wherein the first, second and the further power impulse interval or intervals together form the first group that is not interrupted time-wise, so that the power output from the generator remains sustained during the group interval formed by the first group continuously without interruption and a second power development interval does not occur.

4. Method according to claim 1, wherein to the first group a second group is appended, within which the first, second and a further partial cathode or cathodes corresponding to the first group are fed with power impulses within mutually overlapping power impulse intervals, wherein the second group is appended in such a manner to the first group that the first power impulse interval of the second group overlaps with the last power impulse interval of the first group, so that the power output from the generator from the beginning of the first power interval of the first group until the end of the last power interval of the second group remains continuous without interruption and a second power development interval does not occur.

5. Method according to claim 4, further comprising N groups appended to the second group, wherein N is an integer >2 and wherein each (N) group is appended to the (N−1) group.

6. Method according to claim 5, wherein the number N of the groups is chosen only so large that for each partial cathode n, it is true that the sum of the power impulse intervals tpn, assigned to each partial cathode n, minus respectively an overlap tdn over all groups 1 to N a maximum time of 100 ms is not exceeded.

7. Method according to claim 1, wherein during a loss interval, the power delivered by the generator is supplied to a load not used for a coating, wherein the loss interval includes at least the power development interval and the loss interval overlaps with the first power impulse interval of the first group and the loss interval forms together with the first group an uninterrupted sequence.

8. Method according claim 1, wherein repeated multiple times and that after a last power impulse interval of a last group respectively the generator is switched off for a pause and the pause is chosen to be so long that the power averaged over time delivered to the partial cathodes and taking into account the pause corresponds to a predefined value.

9. Method according to claim 1, wherein a power averaged over time delivered at the partial cathodes is below 10 kW, wherein a discharge current density that prevails momentarily and locally on the partial cathodes is greater than 0.2 A/cm$^2$.

10. Method according to claim 1, wherein when the first power impulse interval and the second power impulse interval have different durations, the overlap in time between the first power impulse interval and the second power impulse interval is no larger than x % of the power impulse interval that has a shorter duration, wherein x smaller than or equal to 10.

11. Method according to claim 1, wherein the PVD sputtering cathode comprises several further partial cathodes.

12. Method according to claim 1, wherein the predefined output of the generator is at least 40 kW.

13. Method according to claim 1, wherein the predefined output of the generator is at least 60 kW.

14. Method according to claim 1, wherein a power averaged over time delivered at the partial cathodes is at 5 kW, wherein a discharge current density that prevails momentarily and locally on the partial cathodes is greater than 0.2 A/cm$^2$.

* * * * *

UNITED STATES PATENT AND TRADEMARK OFFICE
CERTIFICATE OF CORRECTION

Page 1 of 1

PATENT NO. : 9,267,200 B2
APPLICATION NO. : 14/112757
DATED : February 23, 2016
INVENTOR(S) : Siegfried Krassnitzer et al.

It is certified that error appears in the above-identified patent and that said Letters Patent is hereby corrected as shown below:

In the Specification,

Column 3, line 28, replace "n channel number (= number of partial cathodes, $n = 0...8$, $n = 0$ corresponds to the dummy cathode)" with -- n channel number (= number of partial cathodes, $n = 0...6$, $n = 0$ corresponds to the dummy cathode) --.

Column 4, line 55, replace "380" with -- 360 --.

Column 4, line 64, replace "1000*8*(0.05ms-0.02ms)+0.5" with -- 1000*6*(0.05ms-0.02ms)+0.5 --.

In the Claims,

Column 7, line 2, replace "and that" with -- wherein --.

Signed and Sealed this
Twenty-fourth Day of May, 2016

Michelle K. Lee
*Director of the United States Patent and Trademark Office*